(12) United States Patent
Fan et al.

(10) Patent No.: US 9,412,439 B1
(45) Date of Patent: Aug. 9, 2016

(54) HYBRID TFET-MOSFET CIRCUIT DESIGN

(71) Applicants:Taiwan Semiconductor Manufacturing Company, Ltd., Hsin-Chu (TW); National Chiao Tung University, Hsinchu (TW)

(72) Inventors: Ming-Long Fan, Guoxing Township (TW); Pi-Ho Hu, Hsin-Chu (TW); Yin-Nien Chen, Hsin-Chu (TW); Pin Su, Jhubei (TW); Ching-Te (Kent) Chuang, New Taipei (TW); Samuel C. Pan, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/599,327

(22) Filed: Jan. 16, 2015

(51) Int. Cl.
*G11C 11/41* (2006.01)
*G11C 11/419* (2006.01)
*G11C 11/412* (2006.01)
*G11C 11/417* (2006.01)

(52) U.S. Cl.
CPC ............ *G11C 11/419* (2013.01); *G11C 11/412* (2013.01); *G11C 11/417* (2013.01)

(58) Field of Classification Search
CPC ... G11C 11/412; G11C 11/417; G11C 11/419
See application file for complete search history.

(56) References Cited

U.S. PATENT DOCUMENTS

| | | | | |
|---|---|---|---|---|
| 5,831,897 A | * | 11/1998 | Hodges | G11C 11/412 365/154 |
| 7,471,546 B2 | * | 12/2008 | Matick | G11C 11/412 365/154 |
| 8,824,197 B2 | * | 9/2014 | Moriwaki | G11C 11/419 365/156 |
| 2012/0106236 A1 | | 5/2012 | Singh et al. | |
| 2014/0071737 A1 | * | 3/2014 | Sharma | G11C 11/419 365/156 |

OTHER PUBLICATIONS

Chang, L. et al., "Stable SRAM Cell Design for the 32 nm Node and Beyond," Symposium on VLSI Technology Digest of Technical Papers, Jun. 2005, pp. 128-129.
Kim, D et al., "Low Power Circuit Design Based on Heterojunction Tunneling Transistors (HETTs)," ISLPED '09, Proceedings of the 2009 ACM/IEEE International Symposium on Low Power Electronics and Design, Aug. 2009, pp. 219-224.
Mukundrajan, R. et al., "Ultra Low Power Circuit Design using Tunnel FETs," (ISVLSI) 2012 IEEE Computer Society Annual Symposium on VLSLI, Aug. 19-21, 2012, pp. 153-158.
Saripalli, et al., "Variation-Tolerant Ultra Low-Power Heterojunction Tunnel FET SRAM Design," IEEE/ACM International Symposium on Nanoscale Architectures (NANOARCH), Jun. 8-9, 2011, pp. 45-52.
Yang, X et al., "Robust 6T Si tunneling transistor SRAM design," Design, Automation & Test in Europe Conference & Exhibition, Mar. 14-18, 2011, pp. 1-6.

* cited by examiner

*Primary Examiner* — Vanthu Nguyen
(74) *Attorney, Agent, or Firm* — Slater Matsil, LLP

(57) ABSTRACT

A circuit includes a hybrid switch, which includes a Tunnel Field-Effect Transistor (TFET) having a first source, a first drain, and a first gate. The hybrid switch further includes a Metal-Oxide-Semiconductor Field-Effect Transistor (MOSFET) connected to the TFET in parallel, with the MOSFET including a second source connected to the first source, a second drain connected to the first drain, and a second gate connected to the first gate.

20 Claims, 10 Drawing Sheets

HYBRID TFET-MOSFET CIRCUIT DESIGN

BACKGROUND

Metal-oxide-semiconductor (MOS) devices are key components of integrated circuits. A MOS device can work in three regions, depending on gate voltage $V_g$ and source-drain voltage $V_{ds}$, linear, saturation, and sub-threshold regions. The sub-threshold region is a region where $V_g$ is smaller than the threshold voltage $V_t$. A parameter known as Sub-threshold Swing (SS) represents the easiness of switching the transistor current off and thus is an important factor in determining the speed of a MOS device. The sub-threshold swing can be expressed as a function of m*kT/q, where m is a parameter related to capacitance. The sub-threshold swing of a typical MOS device has a limit of about 60 mV/decade (kT/q) at room temperature, which in turn sets a limit for further scaling of operation voltage VDD and threshold voltage $V_t$. This limitation is due to the diffusion transport mechanism of carriers. For this reason, existing MOS devices typically cannot switch faster than 60 mV/decade at room temperatures. The 60 mV/decade sub-threshold swing limit also applies to FinFETs or ultra thin-body MOSFETs on silicon-on-insulator (SOI) devices. However, even with better gate control over the channel, an ultra thin body MOSFET on SOI or a FinFET can only achieve close to, but not below, the limit of 60 mV/decade. With such a limit, faster switching at low operation voltages for future nanometer devices cannot be achieved.

To solve the above-discussed problem, Tunnel Field Effect Transistors (TFETs) have been explored. TFETs can improve both of these parameters by changing the carrier injection mechanism. In a MOSFET, the SS is limited by the diffusion of carriers over the source-to-channel barrier where the injection current is proportional to kT/q. Hence at room temperature, the SS is 60 mV/dec. In a TFET, injection is governed by the band-to-band tunneling from the valence band of the source to the conduction band of the channel. Accordingly, much lower sub-threshold swing can be achieved. Since the TFETs are often designed to have a p-i-n diode configuration, much lower leakage currents are achieved. Also, the TFETs are more resistant to short-channel effects commonly seen on MOSFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
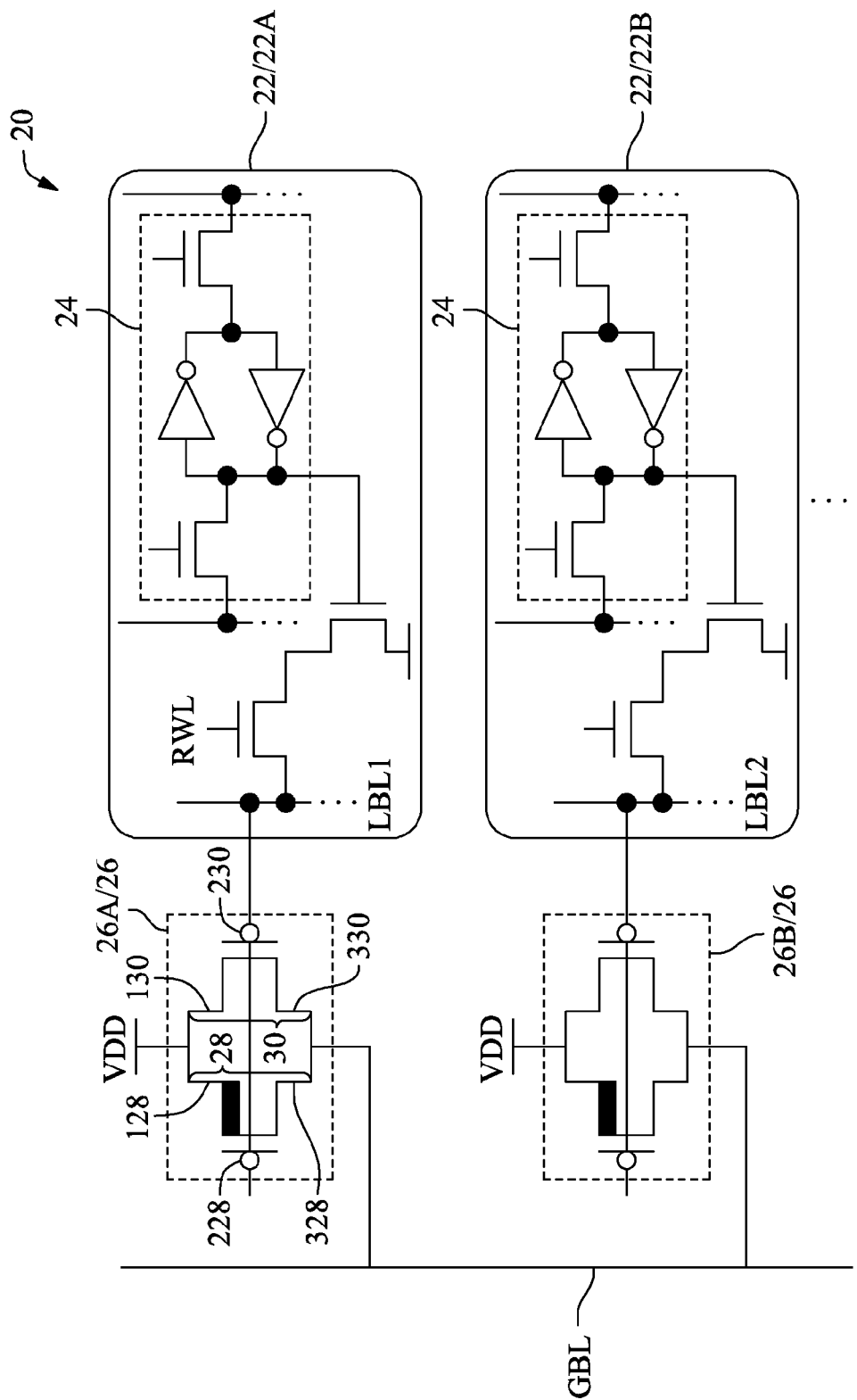
FIG. 1 illustrates a schematic circuit diagram of a Static Random Access Memory (SRAM) circuit adopting hybrid switches in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Hybrid switches including both Tunnel Field-Effect Transistors (TFETs) and Metal-Oxide-Semiconductor Field-Effect Transistors (MOSFETs) and the circuits adopting the hybrid switches are provided in accordance with various exemplary embodiments. The variations of the embodiments are discussed. Throughout the various views and illustrative embodiments, like reference numbers are used to designate like elements.

Throughout the description, when two FETs (including TFETs and MOSFET) are referred to as connected in parallel, the sources of the two FETs are connected to each other, the drains of the two FETs are connected to each other, and the gates of the two FETs are connected to each other. Hence, the two parallel connected FETs act as a single FET. When the parallel connected FETs include a TFET and a MOSFET, the TFET and a MOSFET are in combination referred to as a hybrid FET or a hybrid switch.

Figure 5:
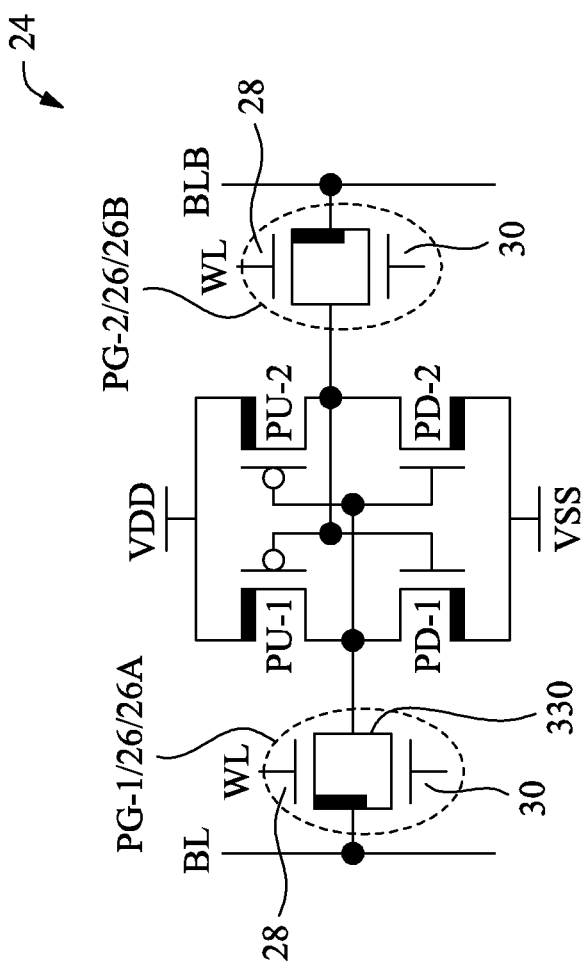
FIG. 5 illustrates a schematic circuit diagram of an SRAM cell adopting hybrid switches in accordance with some embodiments.

FIG. 1 illustrates a schematic circuit diagram of Static Random Access Memory (SRAM) circuit 20 having hierarchical bit lines in accordance with some embodiments of the present disclosure. SRAM circuit 20 includes one or a plurality of SRAM arrays 22 (including 22A and 22B), each including an array of SRAM cells 24, which are arranged as a plurality of rows and columns. SRAM arrays 22 may be the sub-arrays of the same SRAM array. FIG. 1 illustrates one SRAM cell 24 in each of SRAM arrays 22 as an example, although more SRAM cells 24 are included. Also, the structure of SRAM cell 24 is schematically illustrated, and SRAM cells 24 in accordance with the embodiments of the present disclosure may have any suitable structure the same as or different from illustrated. For example, FIG. 5 illustrates an exemplary SRAM cell 24 that may be used in SRAM circuit 20.

Each of SRAM arrays 22 includes a plurality of Local Bit Lines (LBLs), each connected to one column of SRAM cells in the respective SRAM array. FIG. 1 schematically illustrates one of local bit-lines for each of the SRAM arrays 22, wherein the local bit-lines are marked as LBL1 and LBL2.

Local bit lines LBL1 and LBL2 (and other un-illustrated local bit lines) are connected to global bit line GBL. In the following discussion, the read operation of the SRAM cell 24 in SRAM array 22A is discussed as an example. The operation of other SRAM cells is also similar, and hence is not repeated. In accordance with some embodiments of the present disclosure, the connection between global bit line GBL and local bit lines LBL1 and LBL2 are through hybrid switches 26 (including 26A and 26B). In a read operation to read the value in SRAM cell 24 that is in SRAM array 22A, the read word line RWL is provided with a logic high voltage, and hence the value stored in the illustrated SRAM cell 24 is provided to local bit line LBL1.

Hybrid switch 26A includes TFET 28 and MOSFET 30 connected in parallel. TFET 28 is a PFET in accordance with some exemplary embodiments. TFET 28 has an asymmetric structure, wherein source 128 is an n-type region, and the drain 328 is a p-type region. MOSFET 30 is also a PFET in accordance with some exemplary embodiments. MOSFET 30, on the other hand, has a symmetric structure, with both source 130 and drain 330 being p-type regions. Gate 228 of TFET 28 is connected (shorted) to gate 230 of MOSFET 30, with both being connected to local bit line LBL1. Source 128 of TFET 28 and source 130 of MOSFET 30 are connected to power supply voltage VDD. Drain 328 of TFET 28 and drain 330 of MOSFET 30 are connected to global bit line GBL. Throughout the description, sources 128 and 130 are in combination referred to as source 128/130 of hybrid switch 26A, drains 328 and 330 are in combination referred to as drain 328/330 of hybrid switch 26A, and gates 228 and 230 are in combination referred to as gate 228/230 of hybrid switch 26A.

Local bit line LBL1 is connected to gate 228 of TFET 28 and gate 230 of MOSFET 30. In a read operation, global bit line GBL is pre-charged to have a low voltage. When local bit line LBL1 has a logic-low voltage, hybrid switch 26A is turned on, so that global bit line GBL is connected to, and charged by, power supply voltage VDD. The voltage on global bit line GBL thus rises. When local bit line LBL1 has a logic-high voltage, hybrid switch 26A is turned off, so that global bit line GBL remains to have the low voltage. Accordingly, the voltage on global bit line GBL is determined by the voltage of local bit line LBL1, which is further determined by the value stored in SRAM cell 24. Accordingly, the value stored in SRAM cell 24 may be read onto global bit line GBL.

Figure 2:
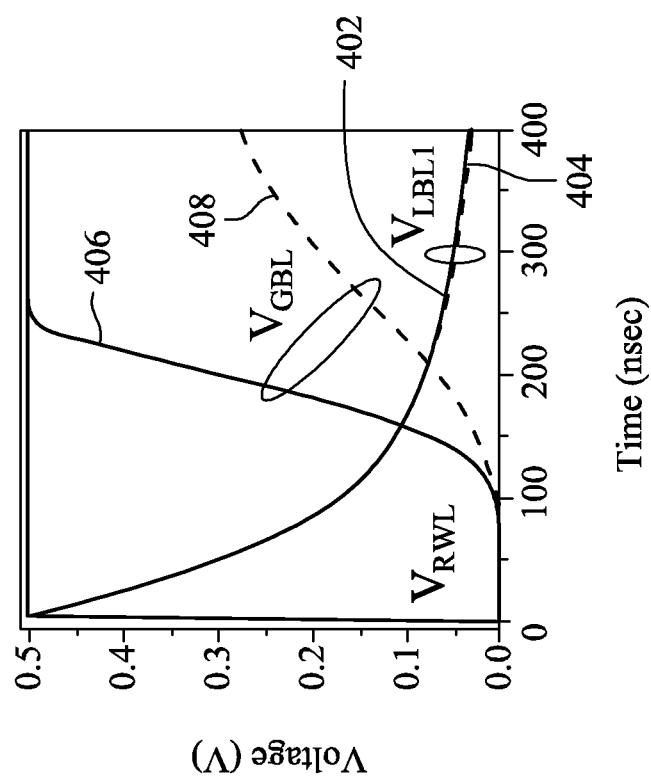
FIG. 2 illustrates the voltages on global bit-lines and local bit-lines of SRAM circuits as a function of time in accordance with some embodiments.

The performance of hybrid switch 26A determines the performance of the SRAM circuit 20 in the read operations. FIG. 2 illustrates some simulation results of SRAM circuit 20 (FIG. 1) in accordance with some embodiments of the present disclosure, wherein voltages $V_{GBL}$ on global bit lines GBL and voltages $V_{LBL1}$ on local bit line LBL1 are illustrated as a function of time (in nano seconds). Solid line 402 illustrates the voltage on local bit line LBL1 as a function of time, and solid line 406 illustrates the voltage on global bit line GBL as a function of time. Time point 0 (nsec) is the time when word line RWL (FIG. 1) is provided with a logic high voltage. At which time, a logic-high voltage is connected to local bit line LBL1, and the voltage on local bit line LBL1 starts to drop (line 402). In the meantime, the voltage on local bit line GBL starts to rise (line 406).

Lines 404 and 408 are provided as a comparison. Lines 404 and 408 are the voltages on local bit line LBL1 and global bit line GBL, respectively, when the hybrid switch 26A in FIG. 1 is replaced with a single p-type TFET. It is observed that the voltage reflected by line 408 (the voltage on global bit line) rises significantly slower than line 406. This result indicates that the performance (the read speed) of the SRAM circuit 20 adopting hybrid switch 26A (FIG. 1) is better than the performance of the SRAM circuit adopting the p-type TFET switch.

One of the reasons that the SRAM circuit adopting the hybrid switch has the improved performance over the SRAM circuit adopting the p-type TFET switch is that in the hybrid switch, a MOSFET is added, which compensates for the delayed saturation of the TFET that is connected in parallel to the MOSFET. Accordingly, the charging of the global bit line GBL is expedited, and the performance of SRAM circuit 20 is improved.

Figure 3:
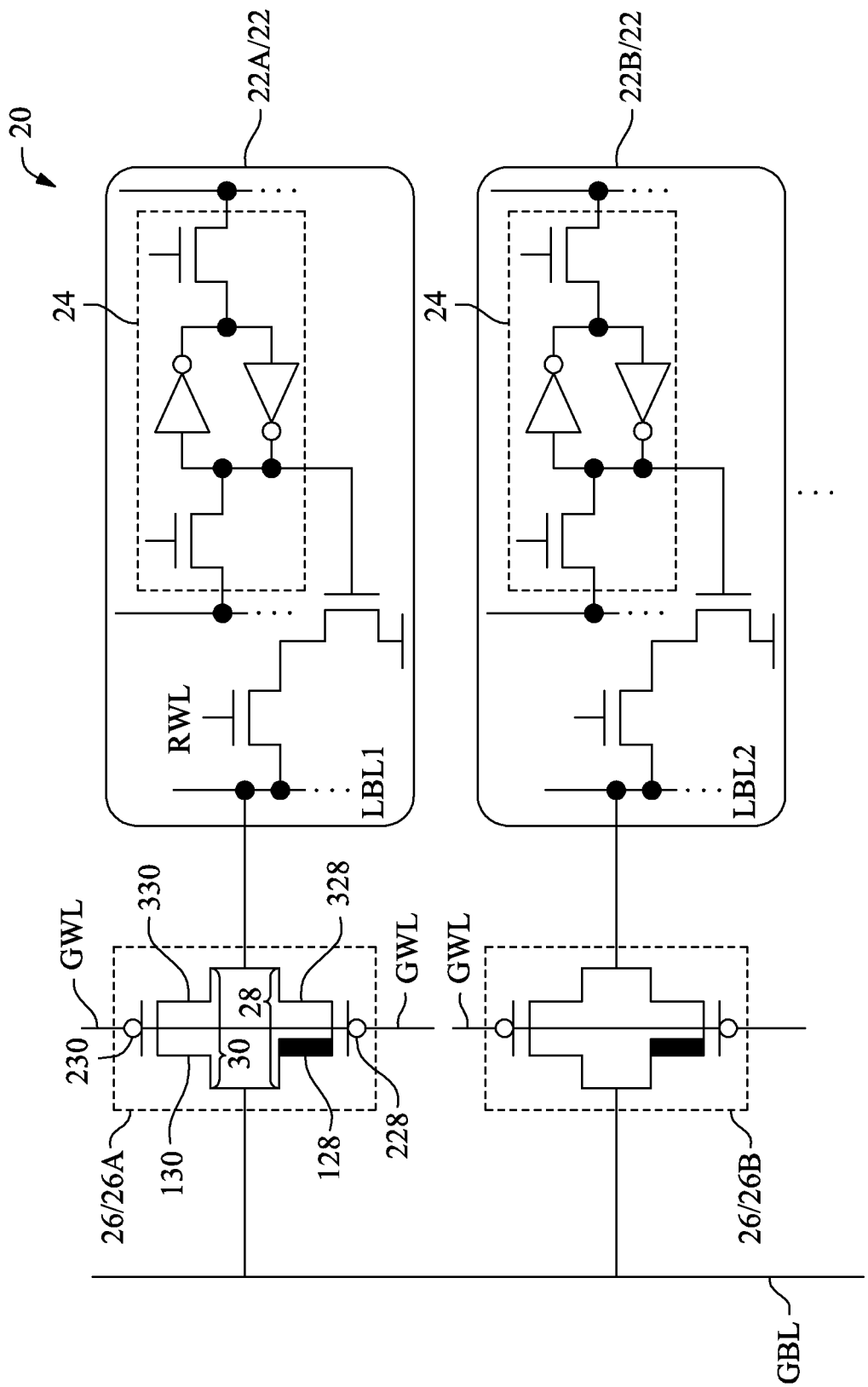
FIG. 3 illustrates a schematic circuit diagram of another SRAM circuit adopting hybrid switches in accordance with some embodiments.

FIG. 3 illustrates SRAM circuit 20 having hierarchical bit lines in accordance with alternative embodiments of the present disclosure. SRAM arrays 22A and 22B in these embodiments are essentially the same as shown in FIG. 1, and hence the details are not discussed herein. In these embodiments, hybrid switches 26 are also used to connect local bit lines LBL1 and LBL2 to global bit line GBL. The scheme of the connection, however, is different from what is shown in FIG. 1.

As shown in FIG. 3, hybrid switch 26A has its source 128/130 connected to global bit line GBL, drain 328/330 connected to local bit line LBL1, and gate 228/230 connected to global word line GWL. In a read operation, global bit line GBL may be pre-charged to have a low voltage (or a high voltage in alternative embodiments). When global word line GWL is provided with a logic-low voltage, hybrid switch 26A is turned on, and local bit line LBL1 and global bit line GBL start sharing charges. The voltages on local bit line LBL1 and global bit line GBL thus are adjusted according to their voltage levels. For example, when global bit line GBL is pre-charged to a high voltage, and when local bit line LBL1 has a low voltage, the voltage on global bit line GBL is brought down due to the charge sharing. Conversely, when local bit line LBL1 has a high voltage, after the charge sharing, the voltage on global bit line GBL remains high. Accordingly, the voltage on global bit line GBL is determined by the voltage of local bit line LBL1, which is further determined by the value stored in SRAM cell 24. Hence, the value stored in SRAM cell 24 may be read onto global bit line GBL.

Figure 4:
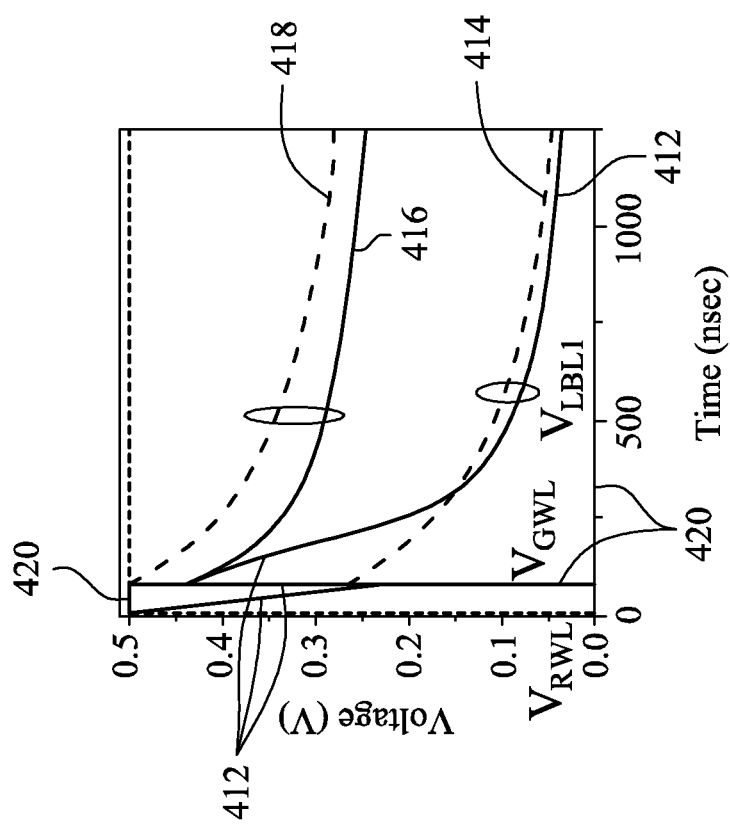
FIG. 4 illustrates the voltages on global bit-lines and local bit-lines of SRAM circuits as a function of time in accordance with some embodiments.

In these embodiments, the performance of hybrid switch 26A determines the performance of the SRAM circuit 20 in the read operations since the performance of hybrid switch 26A determines how fast the charge sharing is. FIG. 4 illustrates some simulation results obtained from SRAM circuits 20 as shown in FIG. 3, wherein the voltages on global bit line GBL and local bit line LBL1 are illustrated as a function of time. Line 420 represents the voltage on global word line GWL. Solid line 412 illustrates the voltage on local bit line LBL1 as a function of time, and solid line 416 illustrates the voltage on global bit line GBL as a function of time. At time point 0 (nsec), both global word line GWL (FIG. 1) and local bit line LBL1 have high voltages. When the voltage on global word line GWL becomes low (line 420), both global bit line GBL and local bit line LBL1 share charge with SRAM cell 24 (FIG. 3), which provides a low voltage. Accordingly, the voltages on both global bit line GBL (line 416) and local bit line LBL1 (line 412) start to drop.

Lines 414 and 418 are provided as a comparison. Lines 414 and 418 are the voltages on local bit line LBL1 and global bit line GBL, respectively, when the hybrid switch 26A in FIG. 3 is replaced with a single p-type TFET. It is observed that the voltage reflected by line 418 (the voltage on global bit line) drops significantly slower than line 416. This result indicates that the performance (the read speed) of the SRAM circuit adopting hybrid switch 26A (FIG. 3) is significantly better than the performance of the SRAM circuit adopting the p-type TFET switch.

FIGS. 1 and 3 illustrate that the hybrid switches, which connect local bit lines to the respective global bit lines, include p-type TFETs and p-type MOSFETs. In accordance with alternative embodiments of the present disclosure, hybrid switch 26 in FIGS. 1 and 3 are replaced with other hybrid switches, each including an n-type TFET and an n-type MOSFET connected in parallel. For example, hybrid switch 28-1 in FIG. 8 may be used to replace hybrid switches 26 in FIGS. 1 and 3.

FIG. 5 illustrates the circuit diagram of SRAM cell 24 in accordance with some exemplary embodiments. As shown in FIG. 5, SRAM cell 24 includes pass-gate transistors 26 (including 26A and 26B, also denoted as PG-1 and PG-2), pull-up transistors PU-1 and PU-2, which are p-type TFETs, and pull-down transistors PD-1 and PD-2, which are n-type TFETs in accordance with some embodiments of the present disclosure. In accordance with alternative embodiments, pull up transistors PU-1 and PU-2 and pull-down transistors PD-1 and PD-2 are all MOSFETs rather than TFETs. Pass-gate transistors 26A and 26B are hybrid switches in accordance with some embodiments of the present disclosure. The gates of pass-gate transistors 26A and 26B are connected to, and controlled by, word-line WL that determines whether SRAM cell 24 is selected or not. A latch formed of pull-up transistors PU-1 and PU-2 and pull-down transistors PD-1 and PD-2 stores a bit. The stored bit can be written into, or read from, SRAM cell 24 through complementary bit lines BL and BLB, wherein BL and BLB may carry complementary bit-line signals. Bit lines BL and BLB may be local bit lines in accordance with some embodiments, which are also the local bit lines in FIGS. 1 and 3. Accordingly, the SRAM cell 24 as show in FIG. 5 may be used in the hierarchical bit line structure as shown in FIGS. 1 and 3 to replace the illustrated SRAM cell 24 in FIGS. 1 and 3. SRAM cell 24 is powered through a positive power supply node VDD that has a positive power supply voltage. SRAM cell 24 is also connected to power supply voltage VSS, which may be an electrical ground.

Hybrid switches 26A and 26B are alternatively referred to as hybrid pass-gate transistors 26A and 26B throughout the description. Since hybrid switches 26A and 26B have a same structure, the structure and the operation of hybrid switch 26A is discussed, and the discussion also applies to hybrid switch 26B. Hybrid switch 26A also includes TFET 28 and MOSFET 30 connected in parallel. In accordance with some embodiments of the present disclosure, TFET 28 and MOSFET 30 are PFETs. In alternative embodiments, TFET 28 and MOSFET 30 are NFETs, as illustrated in FIG. 5. The source region of hybrid switch 26A is connected to bit line BL. The drain region of hybrid switch 26A is connected to the gates of pull-up transistor PU-2 and pull-down transistor PD-2. The gate of hybrid switch 26A is connected to word line WL. Similarly, the source of hybrid switch 26B is connected to bit line bar BLB. The drain of hybrid switch 26B is connected to the gates of pull-up transistor PU-1 and pull-down transistor PD-1. The gate of hybrid switch 26B is connected to word line WL.

Figure 6:
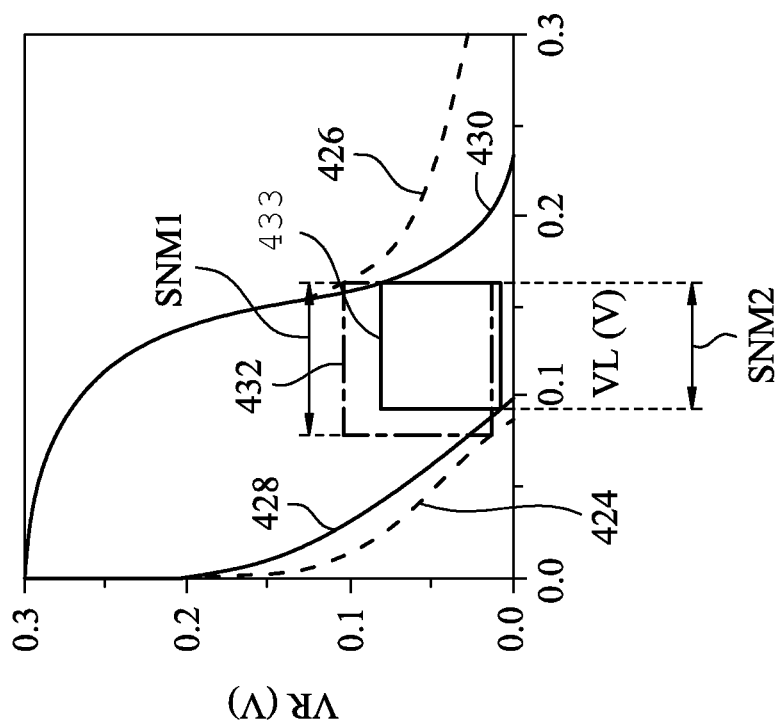
FIGS. 6 and 7 illustrate the writing static noise margins of SRAM cells in accordance with some embodiments.
Figure 7:
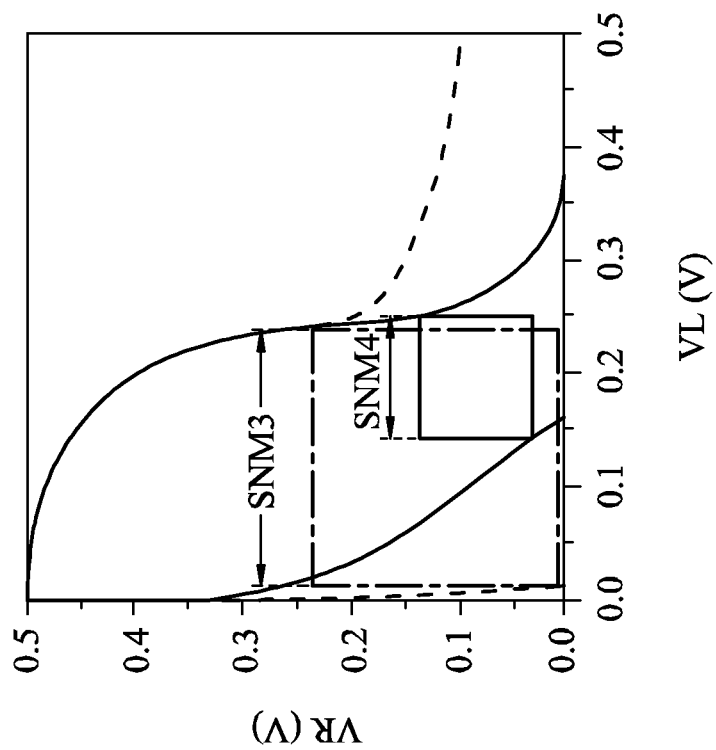

The SRAM cell 24 including the hybrid pass-gate transistors 26 have improved writing static noise margin over the SRAM cells that only use TFETs as pass-gate transistors. For example, FIGS. 6 and 7 illustrate some simulated curves obtained from some exemplary SRAM cells. The X-axis and the Y-axis are input voltages and output voltages of the cross-coupled latches in the SRAM cells. Dashed lines 424 and 426 are obtained from the SRAM cell 24 shown in FIG. 5. Solid lines 428 and 430 are obtained from a SRAM cell wherein all of its transistors are TFETs, and the respective SRAM cell is referred to as an all-TFET SRAM cell throughout the description. Rectangle 432 illustrates how the static noise margin of SRAM cell 24 (FIG. 5) is obtained, wherein the static noise margin of SRAM cell 24 is SNM1. Rectangle 433 illustrates how the static noise margin of the all-TFET SRAM cell is obtained, wherein the static noise margin of the all-TFET SRAM cell is SNM2. FIG. 6 illustrates that static noise margin SNM1 is significantly greater than static noise margin SNM2, indicating that the static noise margin of the SRAM cell having the hybrid pass-gate transistors has a much higher static noise margin than the all-TFET SRAM cell.

The simulation results shown in FIG. 6 are obtained when the power supply voltage VDD (FIG. 5) is equal to 0.3 V. When power supply voltage VDD is increased, the static noise margin of the SRAM cells in accordance with the embodiments of the present disclosure can be further improved. FIG. 7 illustrates the results similar to the results shown in FIG. 6, except that the results in FIG. 7 are obtained when power supply voltage VDD is increased to 0.5 V. The results in FIG. 7 indicate that with the increase of power supply voltage VDD, the static noise margin SNM3 of SRAM cell 24 is further improved over static noise margin SNM4 of the all-TFET SRAM cell. This is because the extra MOSFET in SRAM cell 24 (compared to the all-TFET SRAM cell) provides a current for enhancing the write margin. In addition, MOSFETs have bi-directional behavior, and their currents can flow in opposite directions. TFETs, however, have the uni-directional behavior, and their currents can only flow in a single direction in each TFET. Accordingly, the bi-directional MOSFET (and the corresponding hybrid switch) facilitates a push-pull action to improve the static noise margin.

Figure 8:
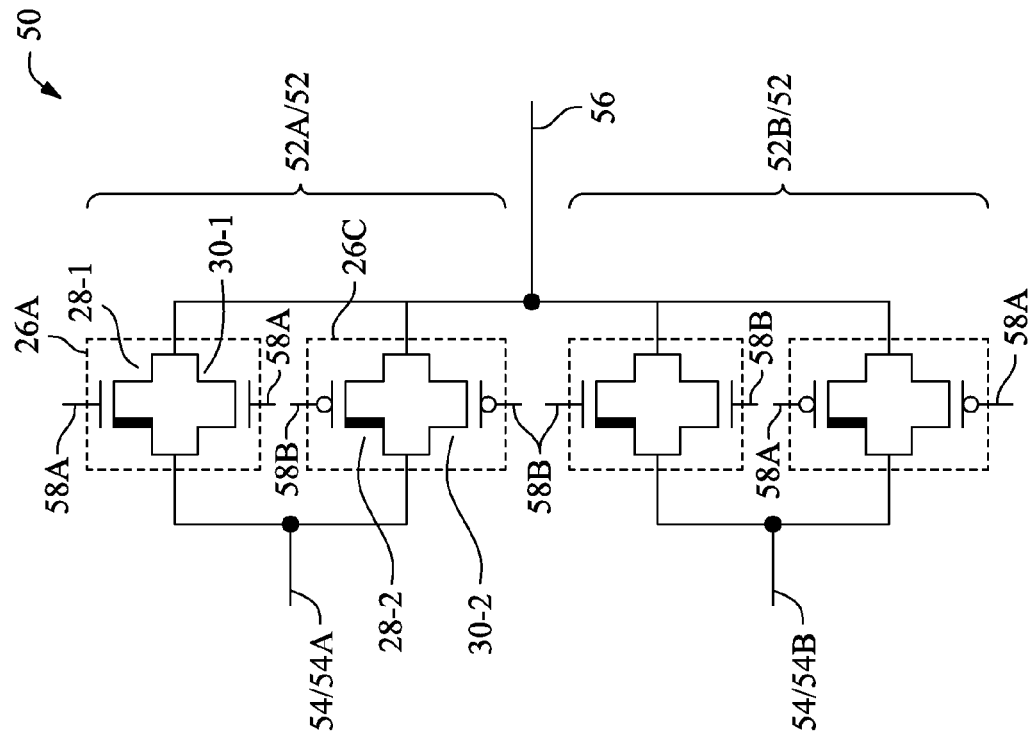
FIG. 8 illustrates a schematic circuit diagram of a multiplexer adopting hybrid switches in accordance with some embodiments.

FIG. 8 illustrates multiplexer 50 in accordance with some embodiments of the present disclosure. Multiplexer 50 includes channels 52 (including 52A and 52B) between inputs 54 (including 54A and 54B) and output 56. Channel 52A is configured to interconnect and disconnect input 54A and output 56. Channel 52B is configured to interconnect and disconnect input 54B and output 56. Selection nodes 58A and 58B are connected to the gates of the transistors in multiplexer 50 to control the selection of one of inputs 54A and 54B, whose datum is passed to output 56 when the respective input is selected. For example, when selection node 58A has a high voltage ("1"), and selection node 58B has a low voltage ("0"), input 54A is selected, and its datum is passed to output 56. Conversely, when selection node 58A has a low voltage ("0"), and selection node 58B has a high voltage ("1"), input 54B is selected, and its datum is passed to output 56.

Each of channels 52A and 52B includes n-type hybrid switch 26A and p-type hybrid switch 26C parallel connected with hybrid switch 26A. In accordance with some embodiments of the present disclosure, in channel 52A, n-type hybrid switch 26A includes n-type TFET 28-1 and n-type MOSFET 30-1 connected in parallel, wherein the gates of n-type TFET 28-1 and n-type MOSFET 30-1 are connected to selection node 58A. P-type hybrid switch 26C includes p-type TFET 28-2 and p-type MOSFET 30-2 connected in parallel, wherein the gates of p-type TFET 28-2 and p-type MOSFET 30-2 are connected to selection node 58B. It is noted that in the same channel 52A (or 52B), all four transistors 28-1, 28-2, 30-1, and 30-2 are connected in parallel.

In accordance with some embodiments, as shown in FIG. 8, the source regions of the TFETs 28-1 and 28-2 connected to input node 54, and the drain regions of TFETs 28-1 and 28-2 are connected to output node 56.

Figure 9:
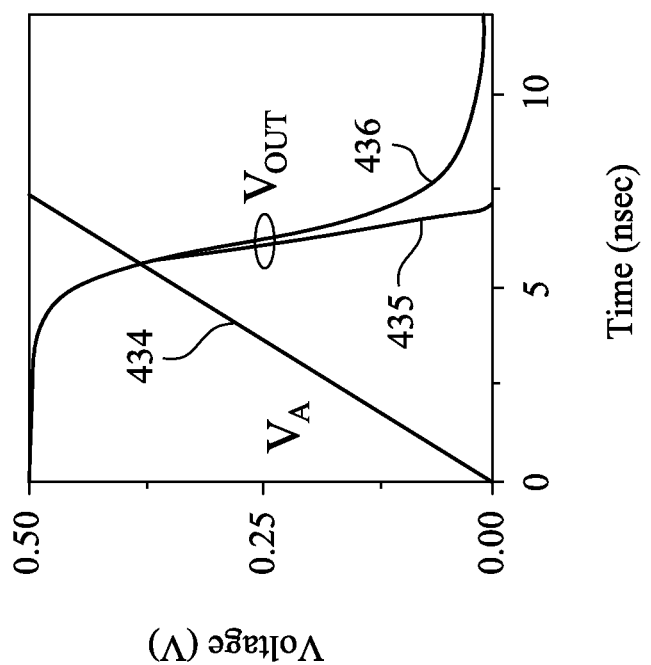
FIG. 9 illustrates the voltages on outputs of multiplexers as a function of time in the writing of datum "0" in accordance with some embodiments.

The multiplexer 50 in accordance with the embodiments of the present disclosure have improved performance over the all-TFET multiplexers include TFETs only. For example, in an all-TFET multiplexer, each of the channels is formed of two TFETs, with the source and drain of one TFET connected to the drain and source, respectively, of the other TFET. FIG. 9 illustrates simulated voltages on the outputs of exemplary multiplexers as a function of time. In FIG. 9, line 434 represents the voltage at the selection node 58A, line 436 represents the output voltage of the all-TFET multiplexer, and line 435 represents the output voltage of multiplexer 50 in FIG. 8. In the simulations, value "0" (a logic low voltage) is to be passed from inputs to outputs. It is observed that line 435 drops much faster than line 436. Accordingly, FIG. 9 illustrates that when a datum "0" is passed from input 54 to output 56, the multiplexer 50 in FIG. 8 has better performance than the all-TFET multiplexer. Alternatively stated, the delay caused by the multiplexers 50 (FIG. 8) is lower compared to the delay caused by the all-TFET multiplexer since the output voltage in multiplexer 50 (FIG. 8) can drop much faster than the all-TFET multiplexers.

Figure 10:
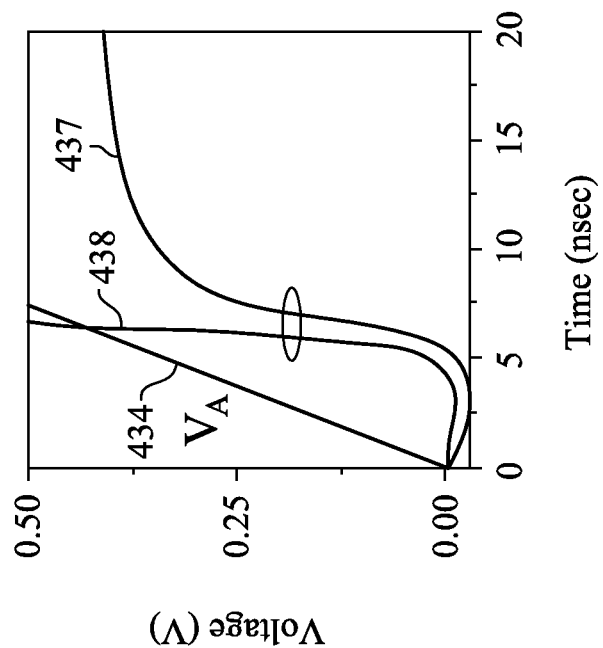
FIG. 10 illustrates the voltages on outputs of multiplexers as a function of time in the writing of datum "1" in accordance with some embodiments.

FIG. 10 illustrates the simulated voltages on the outputs of multiplexers as a function of time. The voltages illustrated in FIG. 10 are obtained when datum "1" is passed from the inputs to the respective outputs. In FIG. 10, line 434 again represents the voltage at the selection node 58A, line 437 represents the output voltage of the all-TFET multiplexer, and line 438 represents the output voltage of multiplexer 50 in FIG. 8. It is observed that line 438 rises much faster than line 437. In addition, line 437 saturates at a low voltage (about 0.42V) much lower than the power supply voltage (0.5V). Accordingly, FIG. 10 illustrates that when datum "1" is passed from input to output, the multiplexer in accordance with the embodiments of the present disclosure has better performance than the all-TFET multiplexer. Alternatively stated, the delay caused by the multiplexers 50 (FIG. 8) in the passing of datum "1" is lower compared to the delay caused by the all-TFET multiplexer since the output voltage in multiplexer 50 (FIG. 8) can rise much faster than the all-TFET multiplexers.

The embodiments of the present disclosure have some advantageous features. TFETs have much lower sub-threshold swing and reduced leakage currents. Accordingly, TFETs are preferred in some circuits over MOSFETs. The circuits adopting TFETs only, however, are not satisfactory due to the delayed saturation and unidirectional behavior of the TFETs. In the embodiments of the present disclosure, hybrid switches/transistors are used, wherein the MOSFETs in the hybrid switches compensate for the delayed saturation and the unidirectional behavior of the TFETs. Accordingly, the circuits including the hybrid switches have the advantageous features of the TFETs, with the disadvantageous features of the TFETs eliminated or at least reduced.

In accordance with some embodiments of the present disclosure, a circuit includes a hybrid switch, which includes a TFET having a first source, a first drain, and a first gate. The hybrid switch further includes a MOSFET connected to the TFET in parallel, with the MOSFET including a second source connected to the first source, a second drain connected to the first drain, and a second gate connected to the first gate.

In accordance with alternative embodiments of the present disclosure, a circuit includes a first SRAM cell and a second SRAM cell, a first and a second local bit line coupled to the first SRAM cell and the second SRAM cell, respectively, a global bit line, and a first hybrid switch and a second hybrid switch. Each of the first and the second hybrid switches includes a TFET and a MOSFET connected to the TFET in parallel. The TFET has a first source, a first drain, and a first gate. The MOSFET includes a second source connected to the first source, a second drain connected to the first drain, and a second gate connected to the first gate. The first hybrid switch and the second hybrid switch connect the first local bit line and the second local bit line, respectively, to the global bit line.

In accordance with yet alternative embodiments of the present disclosure, a circuit includes a multiplexer, which includes an input node, an output node, and a hybrid switch. The hybrid switch includes a TFET and a MOSFET connected to the TFET in parallel. Each of the TFET and the MOSFET has a source region connected to the input node, and a drain region connected to the output node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
 a first hybrid switch comprising:
  a first Tunnel Field-Effect Transistor (TFET) comprising a first source, a first drain, and a first gate; and
  a first Metal-Oxide-Semiconductor Field-Effect Transistor (MOSFET) connected to the first TFET in parallel, with the first MOSFET comprising:
   a second source connected to the first source;
   a second drain connected to the first drain; and
   a second gate connected to the first gate.

2. The circuit of claim 1, wherein the first TFET is a p-type TFET, and the first MOSFET is a p-type MOSFET.

3. The circuit of claim 2 further comprising:
 a second hybrid switch comprising:
  a second TFET; and
  a second MOSFET connected to the second TFET in parallel, wherein the second TFET and the second MOSFET are n-type FETs.

4. The circuit of claim 1, wherein the first TFET is an n-type TFET, and the first MOSFET is an n-type MOSFET.

5. The circuit of claim 1 further comprising a Static Random Access Memory (SRAM) circuit comprising:
 an SRAM array comprising a local bit line; and
 a global bit line, wherein the first hybrid switch connects the local bit line to the global bit line.

6. The circuit of claim 5, wherein the first gate and the second gate are connected to the local bit line, the first source and the second source are connected to a power supply node, and the first drain and the second drain are connected to the global bit line.

7. The circuit of claim 5, wherein the first gate and the second gate are connected to a global word line, the first source and the second source are connected to the global bit line, and the first drain and the second drain are connected to the local bit line.

8. The circuit of claim 1 further comprising a Static Random Access Memory (SRAM) cell, wherein the first hybrid switch acts as a pass-gate transistor of the SRAM cell.

9. A circuit comprising:
   a first Static Random Access Memory (SRAM) cell and a second SRAM cell;
   a first and a second local bit line coupled to the first SRAM cell and the second SRAM cell, respectively;
   a global bit line; and
   a first and a second hybrid switch, each comprising:
      a first Tunnel Field-Effect Transistor (TFET) comprising a first source, a first drain, and a first gate; and
      a first Metal-Oxide-Semiconductor Field-Effect Transistor (MOSFET) connected to the first TFET in parallel, with the first MOSFET comprising:
         a second source connected to the first source;
         a second drain connected to the first drain; and
         a second gate connected to the first gate, wherein the first hybrid switch and the second hybrid switch connect the first local bit line and the second local bit line, respectively, to the global bit line.

10. The circuit of claim 9 further comprising a transistor coupled between the first local bit line and the first SRAM cell, wherein the transistor comprises a gate coupled to a read word line, and a source/drain region connected to the first local bit line.

11. The circuit of claim 9, wherein the first SRAM cell comprises a pass-gate transistor comprising:
    a second TFET; and
    a second MOSFET connected to the second TFET in parallel.

12. The circuit of claim 9, wherein the first TFET is a p-type TFET, and the first MOSFET is a p-type MOSFET.

13. The circuit of claim 9, wherein the first TFET is an n-type TFET, and the first MOSFET is an n-type MOSFET.

14. The circuit of claim 9, wherein the first gate and the second gate are connected to one of the first local bit line and the second local bit line, the first source and the second source are connected to a power supply node, and the first drain and the second drain are connected to the global bit line.

15. The circuit of claim 9, wherein the first gate and the second gate are connected to a global word line, the first source and the second source are connected to the global bit line, and the first drain and the second drain are connected to a selected local bit line, with the selected local bit line being selected from the first local bit line and the second local bit line.

16. A circuit comprising:
    a multiplexer comprising:
       an input node;
       an output node;
       a first hybrid switch comprising:
          a first Tunnel Field-Effect Transistor (TFET); and
          a first Metal-Oxide-Semiconductor Field-Effect Transistor (MOSFET) connected to the first TFET in parallel, wherein each of the first TFET and the first MOSFET comprises a source region connected to the input node, and a drain region connected to the output node.

17. The circuit of claim 16, wherein the first TFET is a p-type TFET, and the first MOSFET is a p-type MOSFET.

18. The circuit of claim 16, wherein the first TFET is an n-type TFET, and the first MOSFET is an n-type MOSFET.

19. The circuit of claim 16 further comprising:
    a second hybrid switch comprising:
       a second TFET; and
       a second MOSFET connected to the second TFET in parallel, wherein the second TFET and the second MOSFET are n-type FETs.

20. The circuit of claim 19, wherein sources of the first TFET and the second TFET are connected to the input node.

* * * * *